(12) United States Patent
Kasica et al.

(10) Patent No.: US 6,838,213 B2
(45) Date of Patent: Jan. 4, 2005

(54) PROCESS FOR FABRICATING A MASK

(75) Inventors: Richard J. Kasica, Knoxville, TN (US); Anthony Novembre, Martinsville, NJ (US)

(73) Assignee: Agere Systems Inc., Allentown, PA (US)

( * ) Notice: Subject to any disclaimer, the term of this patent is extended or adjusted under 35 U.S.C. 154(b) by 183 days.

(21) Appl. No.: 10/200,233

(22) Filed: Jul. 23, 2002

(65) Prior Publication Data

US 2004/0018433 A1 Jan. 29, 2004

(51) Int. Cl.$^7$ .................................................. G03F 9/00
(52) U.S. Cl. ........................................................ 430/5
(58) Field of Search ............................ 430/5, 322, 323, 430/324

(56) References Cited

U.S. PATENT DOCUMENTS

| | | |
|---|---|---|
| 5,260,151 A | 11/1993 | Berger et al. |
| 5,567,551 A | 10/1996 | Yahalom et al. |
| 5,798,194 A | 8/1998 | Nakasuji et al. |
| 5,968,336 A | 10/1999 | Rolfson |
| 6,051,346 A | 4/2000 | Kornblit et al. |
| 6,110,331 A | 8/2000 | Rolfson |
| 6,124,063 A * | 9/2000 | Dauksher et al. ............... 430/5 |
| 6,316,151 B1 * | 11/2001 | Kim et al. ...................... 430/5 |

FOREIGN PATENT DOCUMENTS

JP    4-240719    8/1992

OTHER PUBLICATIONS

J. A. Liddle, et al., "Mask fabrication for projection electron–beam lithography incorporating the SCALPEL technique", J. Vac. Sci. Technol. B9 (6), Nov./Dec. 1991, pp. .3000–3004.

* cited by examiner

Primary Examiner—Saleha R. Mohamedulla

(57) ABSTRACT

A process for fabricating a mask, including depositing a membrane layer on a substrate, etching a backside of the substrate to form membrane windows, depositing at least one scattering layer on the membrane layer depositing a mask layer on the at least one scattering layer exposing the mask layer corresponding to membrane windows to reveal pattern areas, transferring the pattern areas in the mask layer to the at least one scattering layer, transferring at least one of the pattern areas in the at least scattering layer to the membrane layer to produce a hybrid stencil/continuous membrane mask. Alternatively, all of the pattern areas in the at least one scattering layer are transferred to the membrane layer to produce a stencil mask.

17 Claims, 3 Drawing Sheets

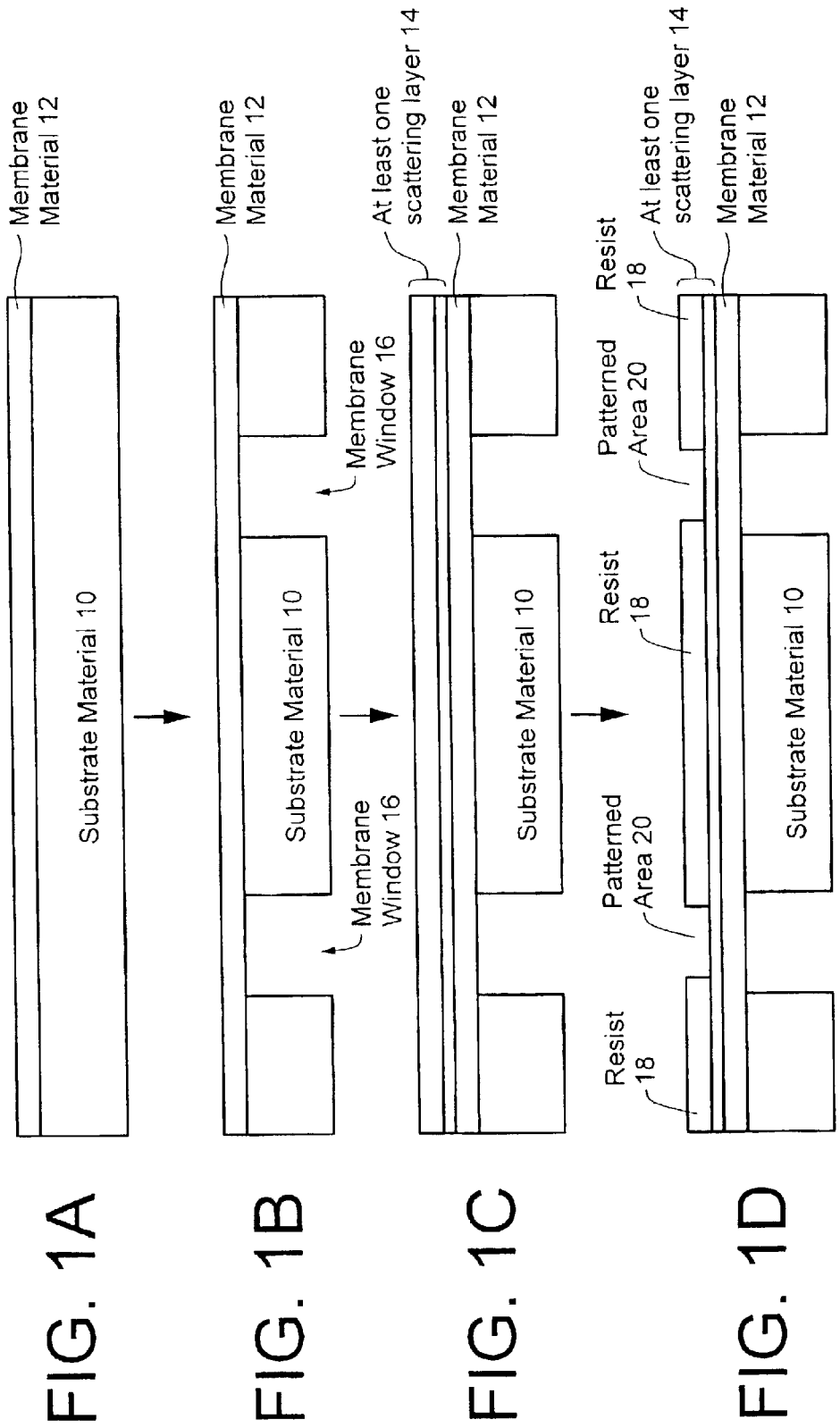

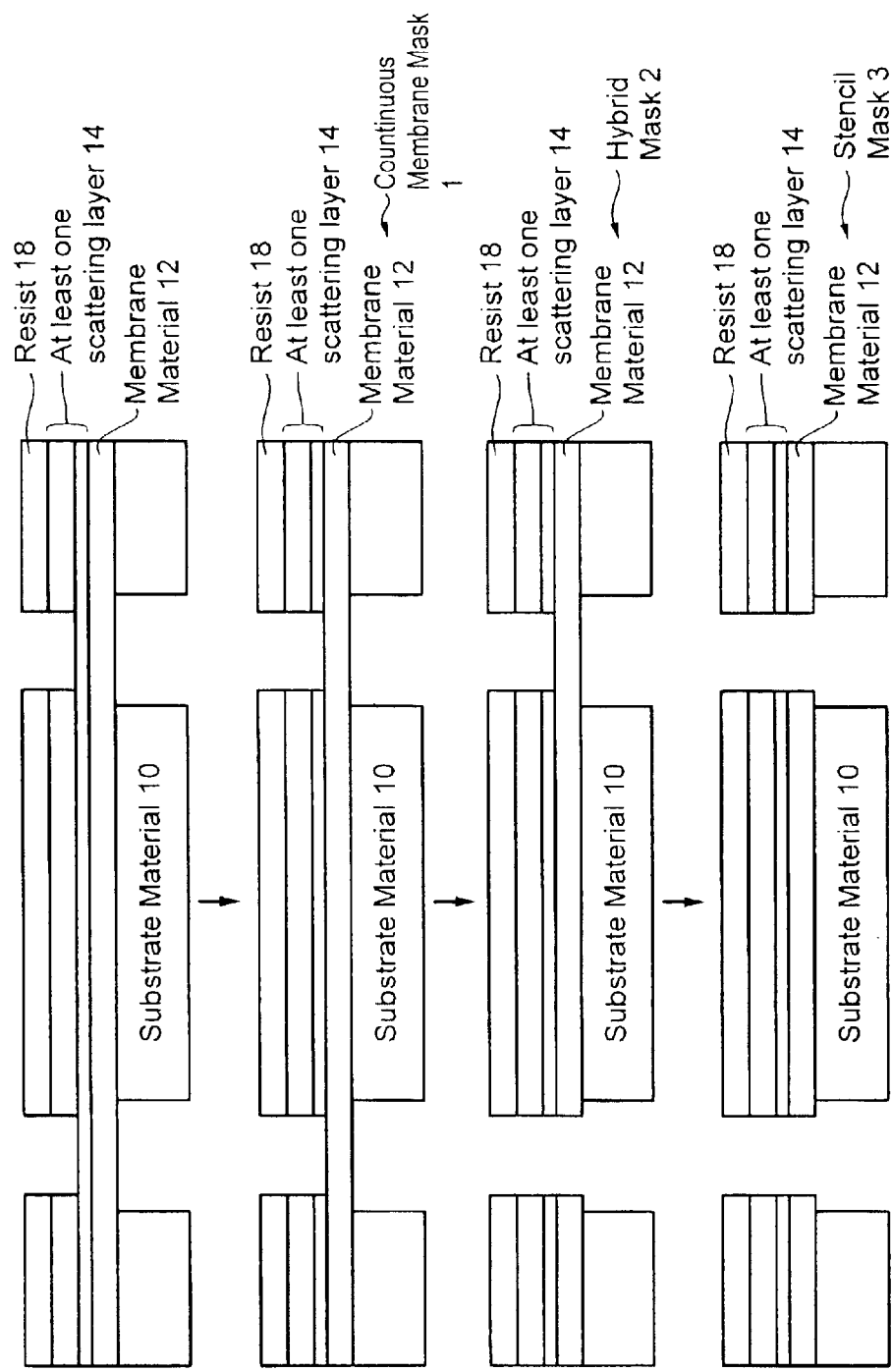

PROCESS FOR FABRICATING A MASK

BACKGROUND OF THE INVENTION

1. Technical Field

This invention relates to the fabrication of masks suitable for lithographic processing.

2. Background Art

Projection electron beam lithography systems such as SCALPEL™ utilize a mask to pattern substrates coated with energy sensitive materials, i.e. resists. Two types of scattering masks are stencil masks and continuous membrane masks. In a scattering stencil mask, openings are provided therein. The openings permit the passage of radiation therethrough. Scattering stencil masks are described in U.S. Pat. Nos. 5,567,551, 5,968,336 and 6,100,331. A method of fabricating a scattering stencil mask is also described in Japanese Patent Publication No. 4-240719. As described in the above, the stencil mask pattern is formed by forming a pattern in the membrane.

In continuous membrane scattering masks, a patterned scattering layer is formed on the membrane. Thus, in a continuous membrane mask, the membrane itself is not patterned. The radiation that passes through the membrane is not scattered significantly. The patterned region that is formed on the continuous membrane scatters the radiation more significantly. The scattering contrast between the insignificantly scattering membrane region and the pattern region in conjunction with an aperture located in the back focal plane of the projection optics of the electron projection exposure tool forms the basis for the image. Continuous membrane scattering masks are described in U.S. Pat. Nos. 6,051,346, 5,798,194, and Liddle et al, "Mask Fabrication for Projection electron-beam Lithography Incorporating the SCALPEL Technique," J. Vac. Sci. 9:3000–3004 (November 1991).

Of these two types of masks, the continuous membrane mask is found to provide good mechanical behavior, desirable electron scattering properties and desirable thermal properties that make it a suitable choice for projection electron beam lithography systems. In addition, because the scattering layer is patterned but the membrane that supports the scattering layer is not, the patterning limitations (e.g. the lithographic limitations associated with patterning features with small dimensions and transferring those features into underlying layers) that are associated with stencil mask fabrication are not presented by the fabrication of continuous membrane masks.

There are however advantages gained by using a stencil mask, such as increased contrast. Prior art processing has described methods used to specifically fabricate masks of either a stencil or a continuous membrane mask.

SUMMARY OF THE INVENTION

In at least one exemplary embodiment, the present invention is directed to a process for fabricating a mask. In particular, in at least one exemplary embodiment, the present invention is directed to a process flow that enables the fabrication of at least two different types of masks using a similar core sequence of process steps.

In electron projection lithography applications for lithographically defining features onto a substrate, it may be advantageous to utilize a common mask blank and, by varying the processing, be able to produce a mask of any type.

Depending on the desired lithographic performance, it may be desirable to have access to at least two different types of masks, including, for example, a stencil mask, a hybrid stencil/continuous membrane mask, or a continuous membrane mask. In other instances, for example, commercial processing, it may be advantageous to be able to produce any of these types of masks and may be advantageous to be able to produce any of these types of masks using similar process steps and/or similar starting materials.

In at least one exemplary embodiment, the present invention is directed to a method that uses similar and/or the same processing steps and/or similar and/or the same starting components to fabricate either a stencil mask or a hybrid stencil/continuous membrane mask, or other type of mask. Advantageously, the core steps of the process of the present invention can also be used to produce a continuous membrane mask.

In at least one exemplary embodiment, the present invention is directed to a method by which two or more mask types may be formed on a common substrate. For example, in at least one exemplary embodiment of the present invention, a hybrid stencil/continuous membrane mask may be formed on one common substrate.

In at least one exemplary embodiment, the present invention provides a process methodology by which a continuous membrane mask is formed as an intermediate step. From the intermediate continuous membrane mask, either a hybrid stencil/continuous membrane mask or a pure stencil mask is formed. The two types of masks are fabricated using the same or similar processing steps, using the same or similar processing equipment, from the same or similar starting materials. In at least one exemplary embodiment, the present invention use a common starting format, that is a common mask blank which is first processed into a continuous membrane mask and then further processed into a hybrid stencil/continuous membrane, or a pure stencil mask.

In at least one exemplary embodiment of the present invention, the mask blank includes a thin film membrane layer (for example, of silicon nitride ($SiN_x$)) which is deposited onto a silicon wafer substrate onto which are then deposited one or more scattering layers over the silicon nitride. The one or more scattering layers are stronger scatterers than the thin silicon nitride layer. The thickness of a silicon nitride membrane that is required to provide adequate scattering contrast between it and the stronger scattering layer formed thereon is well known to one skilled in the art and not discussed in detail herein. Typical requirements for the one or more scattering layers are that they exhibit good charged (e-) particle beam scattering properties and have good thermal stability (low coefficient of thermal expansion). The scattering layers most typically used have been chromium (Cr) and tungsten (W).

Together with the $SiN_x$, the Cr and W layers provide a level of tunability to the mask by means of stress balancing the individual layers. In at least one exemplary embodiment of the present invention, the mask has a composite structure with an overall stress being slightly tensile. The slight tension helps creates a mechanically stable mask that can then withstand the processing steps required to produce a stencil, continuous membrane, or hybrid mask.

In at least one exemplary embodiment of the present invention, a common mask blank is formed by etching the silicon substrate from the backside (non-membrane coated side) to provide windows through the substrate to the membrane windows (membrane window hereinafter) and further define struts of substrate material. The top side (or scatterer side) is coated with an energy-definable resist material (resist material hereinafter).

In at least one exemplary embodiment of the present invention, a pattern in defined in the resist material. An image of the pattern is introduced into the resist material and the pattern is subsequently developed using well known lithographic techniques that are not described in detail herein. The patterned resist layer is referred to as an etch mask. The pattern of the etch mask is then transferred into the underlying scattering layers using conventional etching techniques such as, for example, reactive ion etching (RIE). A tungsten (W) scattering layer may be etched using a F-based plasma etchant, such as $SF_6:O_2$ plasma. A Cr layer may be etched using a Cl-based plasma etchant, such as $Cl_2:O_2$ plasma. To complete an intermediate continuous membrane mask, any remaining resist may be removed in an oxygen ($O_2$) plasma. However, if further processing is contemplated to form either a stencil mask or a hybrid stencil/continuous membrane mask, it is not necessary to strip remaining resist at this point in the process.

To fabricate the stencil mask features from the intermediate continuous membrane mask, at least a portion of the $SiN_x$ layer that is exposed through the patterned scattering layer/mask layer is then etched away. A $SF_6:O_2$ plasma is used to etch through selected exposed areas in the membrane followed by an $O_2$ plasma etch to remove any remaining resist.

For a hybrid stencil/continuous membrane mask only some portions of the membrane that are exposed through the patterned scattering layer are ultimately removed. That is in some regions, the scattering layer is etched through to the membrane. In these regions a window is formed through the scattering layer and the window terminates at the membrane. These are continuous membrane regions of the mask. In other regions, the scattering layer is etched through and the underlying membrane layer is also etched away. These are the stencil regions of the mask. In order to obtain a mask with both stencil mask regions and continuous mask regions, the dose of the energy introduced into the resist is modulated differently, depending on whether the region is the stencil mask region or the continuous membrane mask region. For example, the dose in the resist (assuming a positive resist) covering the stencil areas is selected so that resist exposed to radiation is completely removed following development. With the exposed resist removed, pattern transfer proceeds through the underlying $SiN_x$ membrane layer. The dose in the resist covering the continuous membrane mask region is selected to be lower than the dose required for complete removal of the exposed resist following development. The remaining thickness of the exposed resist following development acts as an etch mask so that pattern transfer is completed before the $SiN_x$ membrane underlying the removed regions of the scattering layer(s) is etched away. After the stencil regions are formed, an $O_2$ plasma etch could again be used to remove any remaining resist.

BRIEF DESCRIPTION OF THE DRAWINGS

FIGS. 1A–1H are a schematic depiction of the process flow used to manufacture a stencil or continuous membrane scattering mask from a common membrane mask structure in one exemplary embodiment of the present invention.

DETAILED DESCRIPTION

Figure 2:
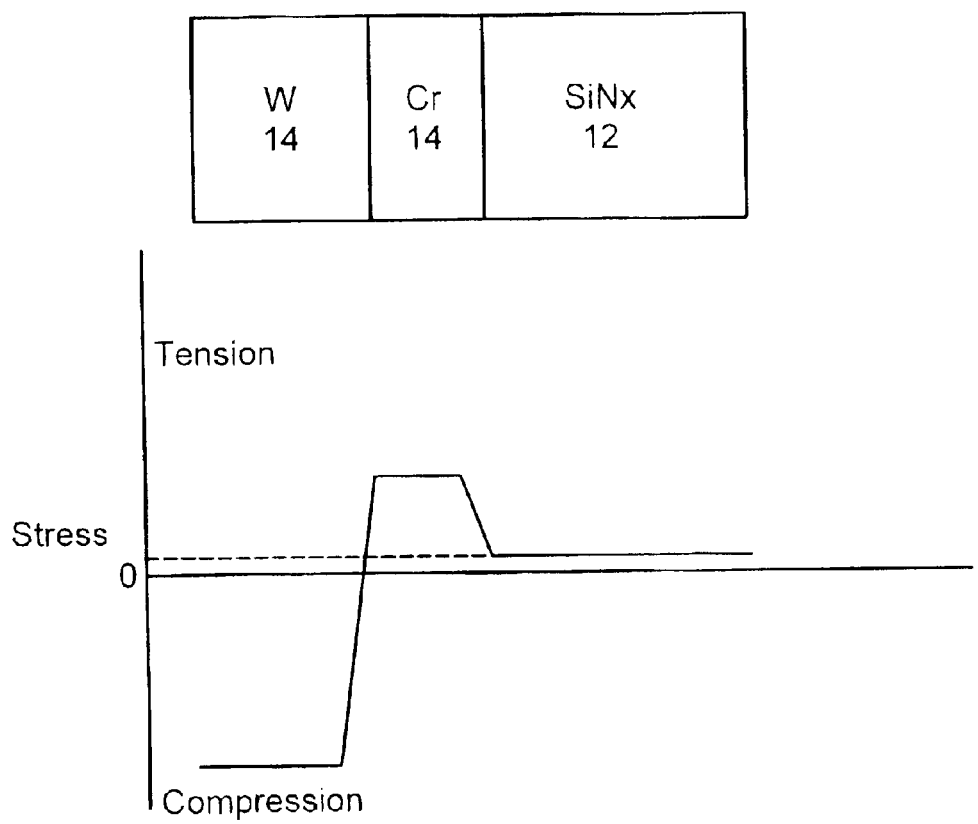
FIG. 2 is a graph showing stress balancing in one exemplary embodiment of the present invention.

FIGS. 1A–1H illustrate an exemplary embodiment of the present invention for manufacturing a stencil mask 1, a hybrid mask 2, or continuous membrane mask 3. As illustrated in FIG. 1A, a substrate material 10, for example, a type {100} silicon wafer, is provided and a thin film of membrane material 12, for example, $SiN_x$ is deposited thereon. The thin film of membrane material 12 may be deposited using a chemical vapor deposition process. Further, the thin film of membrane material 12 may be deposited on both sides (the top or scatterer side and the bottom side as oriented in FIG. 1A) of the substrate material 10.

As illustrated in FIG. 1B, the backside of the substrate material 10 is etched to reveal membrane windows 16 using known methods. U.S. Pat. No. 6,051,346, describes exemplary methods for performing this step.

As illustrated in FIG. 1C, at least one scattering layer 14 may then be deposited on the top side. The at least one scattering layer 14 may be deposited using physical vapor deposition methods, e.g. sputtering to a desired thickness while keeping within stress levels. Then at least one scattering layer 14 may include at least one Cr layer, at least one W layer or both. It is noted that the backside etching of the substrate material 10 may also be performed before or after any of the depositing steps.

As illustrated in FIG. 1D, a resist 18 is coated on the top side and is lithographically exposed and developed to reveal patterned areas 20 within the membrane windows 16.

As illustrated in FIGS. 1E and 1F, in an exemplary mask which includes both at least one W and at least one Cr scattering layer, both scattering layers may be etched using, for example, reactive ion etching (RIE). A fluorine-based plasma, such as $SF_6:O_2$ plasma, may be used to etch the at least one W layer and a chlorine-based plasma, such as $Cl_2:O_2$ plasma, may be used to etch the at least one Cr layer. At this point, a continuous membrane mask 1 is completed.

As illustrated, for a stencil (FIG. 1H) or hybrid (FIG. 1G) stencil/continuous membrane mask, the thin film of membrane material 12 is etched, for example, using a fluorine-based plasma to form pattern areas 20 in all (stencil) or some (hybrid) of the membrane windows 16. This could be accomplished, for example, by dose-modulating the resist. In particular, where the pattern is intended to etch through the membrane material 12, a larger dose should be applied to the resist 18 in the stencil regions to define the pattern windows. Conversely, in pattern areas where the membrane 12 is to remain intact, a lower dose should be applied to the resist 18 in the continuous membrane mask regions of the resist to define the pattern windows. In the continuous membrane mask regions, during the etching process, the resist 18 is removed, the at least one scattering layer 14 is patterned, and the membrane 12 remains intact. Techniques for dose modulation in the resist to achieve the objective of etching through the membrane in selected regions are well known to one skilled in the art and are not described in detail herein.

Areas targeted as continuous are patterned using a dose to pattern the resist 18, which is less than the dose used to pattern the resist for the areas targeted to produce a stencil pattern. The lower dose results in only a partial development of the resist 18, thereby protecting the underlying membrane 12 when the stencil part of the mask is being formed and while at the same time patterning of the at least one scattering layer 14 above the membrane portion of the mask is being accomplished.

All three types of masks, continuous membrane mask 1, hybrid stencil/continuous membrane mask 2, and stencil mask 3 may then be subjected to an $O_2$-based plasma to remove any remaining resist materials thus completing the processes used to form a continuous membrane mask 1, hybrid stencil/continuous membrane mask 2, or stencil mask 3.

FIG. 2 shows a graph of typical stress relationships between two exemplary scattering layers 14, a Cr layer and a W layer and a $SiN_x$ layer 12. The $SiN_x$ layer 12 may be deposited in slight tension with the W layer in compression and the Cr layer in tension. The net effect of the composite structure may be tuned to form a slightly tensile stress balance resulting in a mechanically robust mask blank.

In at least one exemplary embodiment, the continuous membrane mask 1, hybrid stencil/continuous membrane mask 2, or stencil mask 3 may be used for projection electron beam lithography, and more specifically for SCALPEL™ electron beam lithography.

It is noted that although the exemplary embodiments of the present invention have been described in the context of scattering type masks, the present invention is also applicable to other types of masks, such as absorbing masks.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A process for fabricating a mask, comprising:
   a) depositing a membrane layer on a substrate;
   b) etching a backside of the substrate to form membrane windows through the substrate to the membrane;
   c) depositing at least one scattering layer on the membrane layer;
   d) forming an energy-sensitive resist layer on the at least one scattering layer;
   e) patterning the energy sensitive resist layer to form a pattern mask having openings in the energy sensitive resist layer, wherein each of the openings is optically aligned with a different corresponding one of the membrane windows;
   f) transferring the mask pattern into the at least one scattering layer underlying the pattern mask and at least a region of the membrane underlying the at least one scattering layer and overlying a membrane window to form a hybrid stencil/continuous membrane mask.

2. The process for, fabricating a mask of claim 1, wherein in said step f), the mask pattern is transferred into the at least one scattering layer and all regions of the membrane underlying the at least one scattering layer and overlaying each of the membrane windows to form a stencil mask.

3. The process for fabricating a mask of claim 1, wherein said step a), the substrate material is a type {100} silicon wafer, the membrane layer is a $SiN_x$, and the membrane layer are formed by deposition using a chemical vapor deposition process.

4. The process for fabricating a mask of claim 1, wherein said step a), the membrane layer is deposited on both sides of the substrate material.

5. The process for fabricating a mask of claim 1, wherein said step c), the at least one scattering layer is deposited using a physical vapor deposition method.

6. The process for fabricating a mask of claim 1, wherein said step c), the at least one scattering layer includes at least one Cr layer, at least one W layer or at last one Cr layer and at least one W layer.

7. The process for fabricating a mask of claim 6, wherein said step c), the at least one Cr layer is etched using a fluorine-based plasma.

8. The process for fabricating a mask of claim 6, wherein said step c), the at least one W layer is etched using a chlorine-based plasma.

9. The process for fabricating a mask of claim 1, wherein a continuous membrane mask is formed in those regions of the membrane into which the mask pattern is not transferred.

10. The process for fabricating a mask of claim 1, wherein said step f), the membrane layer is etched using a fluorine-based plasma.

11. The process for fabricating a mask of claim 2, wherein said step f), the membrane layer is etched using a fluorine-based plasma.

12. The process for fabricating a mask of claim 1, further comprising:
   g) stripping the remaining resist materials using an oxygen-based plasma.

13. The process for fabricating a mask of claim 2, further comprising:
   g) stripping the remaining resist materials using an O-based plasma.

14. The process for fabricating a mask of claim 1, wherein said step b) of etching a backside of the substrate to form membrane windows may be performed at any point in the process prior to the pattern transfer into the membrane.

15. The process for fabricating a mask of claim 1, wherein in said step a), the membrane layer is deposited in tension and in said step c), a W layer is deposited in compression and a Cr layer is deposited in tension to form a mechanically robust mask blank.

16. The process for fabricating a mask of claim 2, wherein the hybrid stencil/continuous membrane mask is a scattering mask.

17. The process for fabricating a mask of claim 1, wherein said step d the energy sensitive resist material is patterned by using a modulated dose of radiation, a first dose in a stencil mask region of the resist and a second dose in a continuous membrane mask region of the resist, thereby defining the region in which the stencil mask is formed and the region in which the continuous membrane mask is formed.

* * * * *